(12) United States Patent
Buijsse et al.

(10) Patent No.: US 11,815,476 B2
(45) Date of Patent: Nov. 14, 2023

(54) METHODS AND SYSTEMS FOR ACQUIRING THREE-DIMENSIONAL ELECTRON DIFFRACTION DATA

(71) Applicant: FEI Company, Hillsboro, OR (US)

(72) Inventors: Bart Buijsse, Eindhoven (NL); Jaydeep Sanjay Belapure, Eindhoven (NL); Alexander Henstra, Eindhoven (NL); Michael Patrick Janus, Eindhoven (NL); Stefano Vespucci, Eindhoven (NL)

(73) Assignee: FEI Company, Hillsboro, OR (US)

( * ) Notice: Subject to any disclaimer, the term of this patent is extended or adjusted under 35 U.S.C. 154(b) by 288 days.

(21) Appl. No.: 17/217,103

(22) Filed: Mar. 30, 2021

(65) Prior Publication Data

US 2022/0317066 A1 Oct. 6, 2022

(51) Int. Cl.
| | | |
|---|---|---|
| G01N 23/205 | (2018.01) | |
| H01J 37/26 | (2006.01) | |
| G01N 23/2055 | (2018.01) | |
| G01N 23/20025 | (2018.01) | |
| G01N 23/20058 | (2018.01) | |
| H01J 37/147 | (2006.01) | |
| H01J 37/22 | (2006.01) | |
| H01J 37/28 | (2006.01) | |

(52) U.S. Cl.
CPC ... *G01N 23/2055* (2013.01); *G01N 23/20025* (2013.01); *G01N 23/20058* (2013.01); *H01J 37/1472* (2013.01); *H01J 37/222* (2013.01); *H01J 37/28* (2013.01); *G01N 2223/03* (2013.01); *G01N 2223/0565* (2013.01); *G01N 2223/0566* (2013.01); *G01N 2223/32* (2013.01); *G01N 2223/3302* (2013.01); *H01J 2237/2802* (2013.01)

(58) Field of Classification Search
CPC .......... G01N 23/20058; G01N 23/205; G01N 23/2055; H01J 37/00
See application file for complete search history.

(56) References Cited

U.S. PATENT DOCUMENTS

2021/0305010 A1* 9/2021 Buijsse ............ H01J 37/32715

FOREIGN PATENT DOCUMENTS

| WO | 2020160671 | 8/2020 | |
|---|---|---|---|
| WO | WO-2020160671 A1 * | 8/2020 | ....... G01N 23/20058 |

OTHER PUBLICATIONS

R. Buecker, P. Hogan-Lamarre, P. Mehrabi, et al, Serial protein crystallography in an electron microscope, Nature Communications, 2020, 11:996, pp. 1-8.

(Continued)

*Primary Examiner* — Eliza W Osenbaugh-Stewart

(57) ABSTRACT

Crystallographic information of crystalline sample can be determined from one or more three-dimensional diffraction pattern datasets generated based on diffraction patterns collected from multiple crystals. The crystals for diffraction pattern acquisition may be selected based on a sample image. At a location of each selected crystal, multiple diffraction patterns of the crystal are acquired at different angles of incidence by tilting the electron beam, wherein the sample is not rotated while the electron beam is directed at the selected crystal.

21 Claims, 11 Drawing Sheets

(56) References Cited

OTHER PUBLICATIONS

Y. Yun, X. Zou, S. Hovmoeller and W. Wan, Three-dimensional electron diffraction as a complementary technique to powder X-ray diffraction for phase identification and structure solution of powders, IUCrJ, Chemistry, 2015, vol. 2, pp. 267-282.

S. Smeets, X. Zou and W. Wan, Serial electron crystallography for structure determination and phase analysis of nanocrystalline materials, Journal of Applied Crystallography, 2018, vol. 51, pp. 1262-1273.

D. Zhang, P. Oleynikov, S. Hovmoller, and X. Zou, Collecting 3D electron diffraction data by the rotation method, Z. Kristallogr., (Structural Chemistry), 225, (2010), pp. 94-102.

\* cited by examiner

METHODS AND SYSTEMS FOR ACQUIRING THREE-DIMENSIONAL ELECTRON DIFFRACTION DATA

INCORPORATION BY REFERENCE

All publications, patents, and patent applications mentioned in this specification are herein incorporated by reference to the same extent as if each individual publication, patent, or patent application was specifically and individually indicated to be incorporated by reference.

FIELD OF THE INVENTION

The present description relates generally to methods and systems for crystallography, and more particularly, to acquiring three-dimensional electron diffraction data for extracting crystallographic information.

BACKGROUND OF THE INVENTION

Crystallographic information of crystals can be obtained based on their three-dimensional (3D) electron diffraction data, that is, electron diffraction patterns acquired from different angles of a crystal relative to an electron beam. In one example, 3D diffraction data may be acquired by tilting crystals relative to a charged particle beam using stage tilt. The sample and/or the charged particle beam is usually shifted during the data acquisition process to compensate for any sample shift introduced by the stage tilt. Such data acquisition workflow may be time consuming due to the need for correction and the relatively slow stage tilt. Further, long exposure may cause radiation damage to the crystal. There is a need to develop efficient and fast workflows for acquiring 3D diffraction data, especially when large amounts of crystals need to be analyzed. Such may be the case when analyzing powders consisting of nanocrystals. Conventionally, such powders can be analyzed by X-ray powder diffraction, but the spectra obtained this way are an ensemble average, and it may be challenging to extract crystallographic information from the X-ray spectra due to the overlap of peaks in the spectra.

SUMMARY

In one embodiment, a method comprises acquiring a sample image of a sample; selecting multiple crystals in the sample image; determining coordinates of the multiple selected crystals; directing an electron beam towards each of the multiple selected crystals, wherein at a location of each selected crystal, adjusting the electron beam to acquire multiple diffraction patterns of the selected crystal at different incident angles, and the selected crystal is not rotated by a sample holder while the electron beam is directed towards the selected crystal; and extracting crystallographic information from the multiple diffraction patterns. By adjusting the incident angles via tilting the electron beam at each selected crystal, the 3D electron diffraction dataset may be quickly and efficiently acquired.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION

Figure 1:
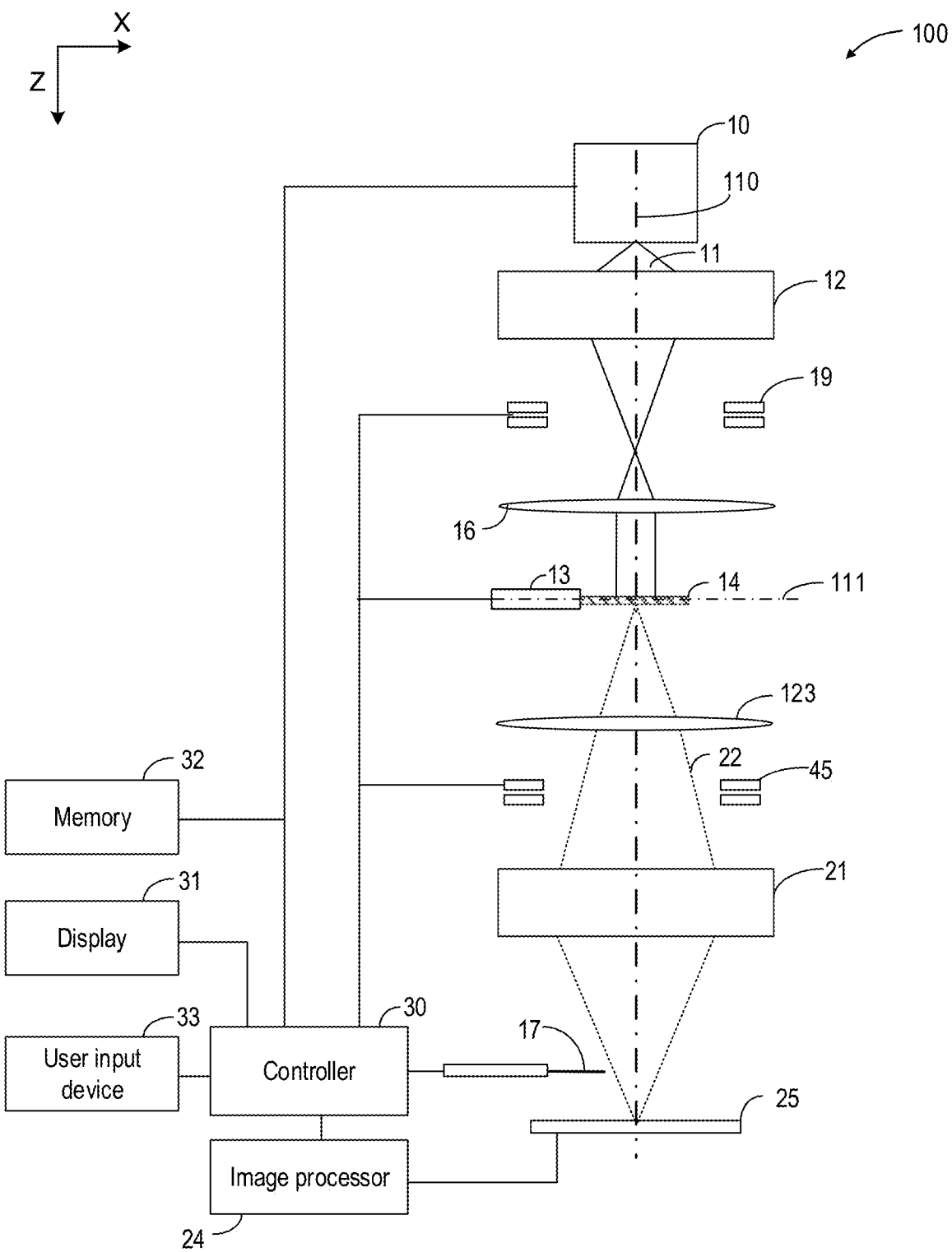
FIG. 1 illustrates an example transmission electron microscopy (TEM) system operated in one mode.
Figure 2:
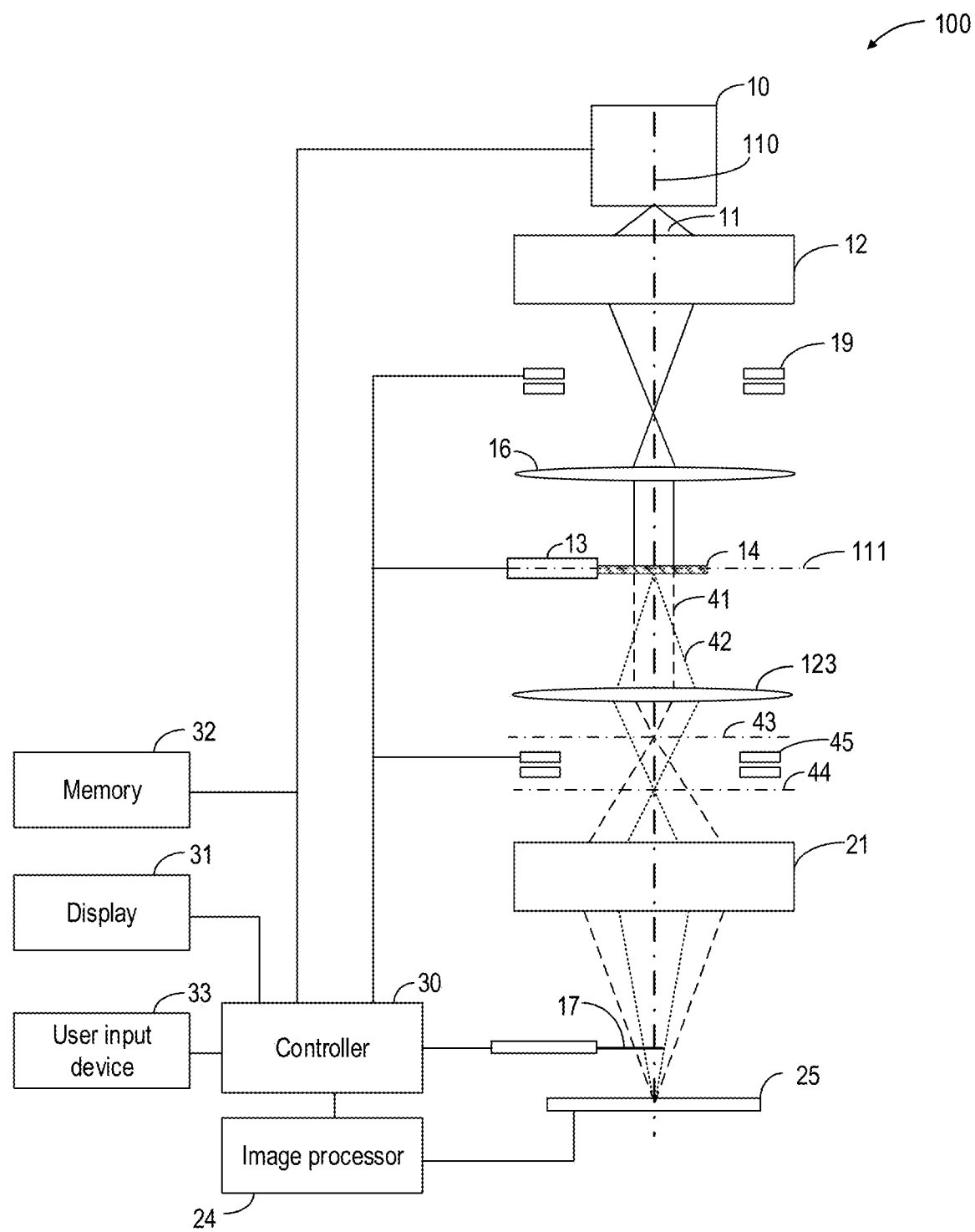
FIG. 2 illustrates the TEM system of FIG. 1 operated in another mode.

The following description relates to systems and methods for acquiring three-dimensional (3D) diffraction data such as 3D electron diffraction (ED) data, to obtain crystallographic information of a sample. The sample may include impurity and/or a collection of crystals of different structure. Multiple 3D ED datasets may be formed from the acquired 3D ED data, wherein each dataset (or a diffraction tilt series) includes a crystal's 3D ED patterns acquired at various angles relative to the electron beam. Structure of a crystal may be obtained by analyzing a subset of 3D ED datasets. Statistically relevant crystallographic information of the sample may be obtained by analyzing all 3D ED datasets. The ED pattern is acquired in a transmission mode, that is, the scattered electrons are acquired from the side of the sample which is opposite from the electron source. The ED patterns may be acquired by a transmission electron microscopy (TEM) system shown in FIGS. 1-2, a bifocal microscopy system shown in FIGS. 3-4, or a scanning transmission electron microscopy (STEM) system. If a TEM system is used, the microscope may be switched between an imaging mode for acquiring the sample image and a diffraction mode for acquiring the ED pattern. Mode switching in the TEM system may require adjusting one or more lenses in the optical column. FIG. 1 shows the TEM system in a low magnification (LM) imaging mode. FIG. 2 shows the TEM system in a selected-area (SA) imaging and SA diffraction mode.

The bifocal microscopy system has been disclosed by Henstra et al. in U.S. patent application Ser. No. 16/834,963 filed on Mar. 30, 2020, and by Buijsse et al. in U.S. patent application Ser. No. 16/835,218 filed on Mar. 30, 2020. Both patent applications are incorporated herein by reference in their entirety and for all purposes. The bifocal microscopy system splits the electron beam generated from an electron source into an imaging beam and a diffraction beam using a bifocal beamformer. The bifocal beamformer changes the focal property of either or both of the imaging beam and the diffraction beam. For example, the two beams focus at different focal planes orthogonal to the optical axis of the microscope. Further, the bifocal beamformer may break the cylindrical symmetry of any one of the two beams. The imaging beam is used for acquiring the sample image and the diffraction beam is used for acquiring the ED pattern. The bifocal system may acquire the sample image and the ED pattern of the same crystal simultaneously. To reduce radiation exposure, either the sample image or the ED pattern may be individually acquired by blocking or blanking the imaging beam or the diffraction beam. Comparing to the TEM system, the bifocal microscopy system can switch between sample imaging and diffraction acquisition in less time and with less error.

In order to solve the crystal structure, a complete 3D ED dataset, that is, ED patterns covering a sufficiently large tilt range of the crystal is needed. In "Serial electron crystallography for structure determination and phase analysis of nanocrystalline materials", J. Appl. Cryst. 51, 1262-1273, Smeets et al. disclose a method of identifying crystal locations in the imaging mode and acquiring one diffraction pattern of each selected crystal at each goniometer position. The collection of diffraction patterns is then used for identifying the crystal structure. However, because only one diffraction pattern is acquired for each crystal, prior information such as lattice parameters and the space group are required for unambiguous indexing the crystals and solving the crystal structure. In "High-throughput continuous rotation electron diffraction data acquisition via software automation", J. Appl. Cryst. 51, 1652-1661, Cichocka et al. disclose determining crystal structure based on continuous rotation electron diffraction, wherein the diffraction patterns are acquired while the crystal rotates. However, Cichocka's method requires crystal tracking during crystal rotation and frequent switching between in-focus diffraction mode and defocus diffraction mode. Applicant recognizes that in order to extract statistically relevant information, such as the phase distribution, polymorphism and chirality of the sample, ED patterns of a large number of crystals have to be acquired. As a result, neither Smeets' nor Cichocka's method is suitable for efficiently extracting statistically relevant crystallographic information.

To solve the above issues, various workflows for acquiring the 3D ED dataset are presented herein. In one example, a sample image of the crystalline sample is first acquired. The sample image is acquired at a resolution at which the size and shape of the crystals may be determined. Multiple crystals shown in the sample image may be selected for acquiring the ED data, and the locations or coordinates of the selected crystals are determined also based on the sample image. The crystals may be selected based on one or more of their size, morphology, distribution, and contrast in the sample image. Multiple ED patterns are acquired for the multiple selected crystals. The electron beam is shifted to irradiate each of the selected crystals and tilted within a range of beam tilt angles so that each ED pattern of the selected crystal has a different angle of incidence. The incident angle is defined by the angle between the incident beam and an axis (such as the optical axis) perpendicular to the sample, as well as the plane of incidence (the plane containing the incident beam and the axis perpendicular to the sample). The incident angles are different when the values of the incident angles are different or the planes of incidence are different. Only beam tilt, but no sample tilt, is used for adjusting the incident angle. In other words, the sample is not rotated/tilted by the sample holder while the electron beam is directed towards the selected crystal. The sample may remain stationary during the entire time that the selected crystal is visited by the electron beam, from the time that the electron beam moves to the selected crystal to the time that the electron beam moves to the next selected crystal. In one example, the incident angle is from −10 to 10 degrees relative to the optical axis. In another example, the incident angle is from −5 to 5 degrees relative to the optical axis. In yet another example, the range of the incident angle is less than 20 degrees. The range of the incident angle is set small to reduce beam movement at the specimen plane due to aberrations of the illumination optics, and this way keep the incoming beam aligned to the crystal position. The range is also set small to keep optical distortion of the diffraction pattern sufficiently small. In one example, the incident angle is adjusted by tilting the electron beam at a fixed angle step, so that the ED patterns may be acquired at multiple discrete incident angles. In another example, the ED patterns may be acquired while continuously tilting the electron beam. The electron beam may be tilted within a plane orthogonal to the specimen plane or multiple planes orthogonal to the specimen plane. In other examples, the beam tilt schemes may be precession at a fixed tilt angle, or precession in combination with tilt angle variation (e.g. spiral scan). In some examples, the beam tilt schemes may incorporate corrections for optical aberrations, to minimize beam displacement at the sample and to correct for small deviations from the desired tilt increment. The electron beam may be tilted by a deflector upstream of the sample. For the bifocal beam system, the deflector may be the bifocal beamformer, wherein the diffraction beam is tilted for ED pattern acquisition. By acquiring multiple ED patterns of the multiple crystals via beam tilt, 3D ED datasets suitable for extracting statistical crystallographic information may be automatically collected. A limited tilt range has two additional advantages, 1) the need to adjust the eucentric stage height when visiting crystals at different z-heights is relaxed, and 2) finer angular sampling allows for better noise reduction when integrating peak intensities.

In another example, the crystalline sample is held on a TEM grid including multiple grid windows for TEM imaging. The TEM grid may include a perforated support foil like lacey carbon. Crystals located within the grid windows can be imaged or probed by the electron beam. The TEM grid may be translated within a specimen plane orthogonal to the optical axis of the imaging system via a sample holder. In order to cover a large TEM grid area, an overview sample image covering multiple windows of the TEM grid is acquired by stitching multiple sample images together. The sample images may be acquired by translating the sample within the specimen plane with the sample holder. Coordinates of the selected crystals are determined based on the overview image. Further, coordinates of the center of each window on the TEM grid may be determined based on the overview image. After moving the center of the window into the FOV of the imaging system by translating the TEM grid with the sample holder and/or shifting the electron beam with a deflector, the selected crystals in each window or in a sub-region of each window may be probed by combined beam shift and beam tilt, without moving the sample.

In another example, after acquiring a first sample image for selecting the crystals, the electron beam location is calibrated before acquiring the multiple ED patterns. The beam location calibration may correct errors introduced by sample movement, such as the sample movement when translating the TEM grid to probe a particular grid window. The beam location calibration may also correct beam displacement due to mode switching. For calibrating the beam location, a second sample image may be acquired. The current beam location may be determined by comparing the second sample image with the first sample image acquired for crystal selection. In one example, the first sample image is an overview image acquired in the LM imaging mode, and the second sample image is acquired in the SA imaging mode. Calibrating the beam location includes registering the SA sample image with the overview image. After calibrating the beam location, the microscope may be adjusted to the SA diffraction mode, and ED patterns of multiple crystals are acquired via combined beam shift and beam tilt. In another example, with the bifocal microscopy system, the beam location may be calibrated with the imaging beam, for example, by comparing the sample images acquired with the imaging beam before and after sample movement. The ED patterns may then be acquired using the diffraction beam based on the calibrated beam location.

In yet another example, after selecting the crystals in the sample image, a diffraction heatmap may be generated by scanning the sample in the diffraction mode. The scanned area may be the same as the field of view (FOV) of the sample image. The diffraction heatmap is formed based on diffraction scores of the ED patterns. The diffraction score representing the quality of the ED pattern. The locations of the selected crystals may be updated based on the diffraction heatmap. Further, based on the diffraction heatmap, the selected crystals may be re-evaluated to identify sub-regions within the crystal for ED pattern acquisition.

Turning to FIGS. 1-2, a transmission electron microscopy (TEM) system 100 is shown in different modes of operation. The TEM system 100 includes an electron source 10 that emits electron beam 11 along optical axis 110, towards condenser optics 12. The electron source 10 may generate high energy electrons, that is, electrons having typical energies of between about 10 keV and 1,000 keV. In some embodiments, the condenser optics 12 may include one or more condenser lenses and one or more apertures. Deflector 19 positioned downstream of the condenser optics 12 shifts and/or tilts the electron beam relative to the optical axis 110. Pre-sample objective lens 16 positioned downstream of the deflector 19 collimates the electron beam and directs the electron beam onto sample 14. The sample 14 may be held by a sample holder 13 in a specimen plane 111. In some examples, the sample is positioned on a TEM grid attached to the sample holder. The sample holder 13 may adjust sample position by tilting the sample relative to the optical axis and/or translating the sample within the specimen plane. Scattered electrons transmitted through sample 14 sequentially passes through post-sample objective lens 123 and projector system 21, and are collected by detector 25 positioned on the opposite side of sample 14 relative to electron source 10. The detector 25 may detect the received electrons and send the signal to image processor 24 to form an image. The detector 25 may include an amplifier for amplifying the signal before sending the signal to the image processor 24. In one example, the detector 25 may be a CCD camera or a CMOS camera. In some embodiments, different detectors may be used for diffraction pattern acquisition and sample image acquisition.

FIG. 1 shows the TEM system 100 operated in the low magnification (LM) imaging mode. Dashed lines 22 illustrate beam path of scattered electrons from a point of the sample to detector 25 in the LM imaging mode, wherein the post-sample objective lens 123 is off or operated with low excitation voltage for acquiring a sample image with large FOV and low resolution. Beam stopper 17 may be used to intercept the intense unscattered beam. The projection system 21 is operated differently in an imaging mode (such as LM imaging mode or SA imaging mode) and in a diffraction mode (such as SA diffraction mode).

FIG. 2 shows the TEM system 100 operated in the SA imaging mode and the SA diffraction mode. Dashed lines 41 illustrate beam path of scattered electrons from sample 14 to detector 25 in the SA diffraction mode. In the SA diffraction mode, the projector system 21 images the back focal plane 43 of the post-sample objective lens 123 to detector 25. The beam stopper 17 is inserted into the optical axis 110 to block the unscattered beam. Dashed lines 42 illustrate beam path of scattered electrons from sample 14 to detector 25 in the SA imaging mode. In the SA imaging mode, the specimen plane 111 is imaged to the SA plane 44, and the projector system 21 images the SA plane 44 to detector 25. The beam stopper 17 is retracted from the optical axis 110. Sample image acquired in the SA imaging mode may have a smaller FOV and higher magnification comparing to the sample image acquired in the LM imaging mode. In one example, a SA aperture may be inserted in the beam path. The SA aperture may be the positioned in the SA plane 44. Alternatively, an aperture in the condenser optics 12 may serve as beam limiting aperture. In another example, an image deflector may be positioned between the sample and the detector for shifting and tilting the electrons transmitted through the sample back to the optical axis, so that the ED pattern stays centered on the detector during beam tilt and the image stays centered on the detector during beam shift. The image deflector 45 may be positioned between the back focal plane 43 and the SA plane 44.

The controller 30 may control the operation of TEM system 100, either manually in response to operator instructions or automatically in accordance with computer readable instructions stored in non-transitory memory (or computer readable medium) 32. The controller 30 may include a processor and be configured to execute the computer readable instructions and control various components of the TEM system 100 in order to implement any of the methods described herein. For example, the controller may adjust the TEM system to operate in any one of the LM imaging mode, SA imaging mode, and the SA diffraction mode by adjusting one or more of the SA aperture 18, the excitation of the objective lens 123, the beam stopper 17, and the projector system 21. The controller 30 may adjust the beam location and/or the beam incident angle on the sample by adjusting the deflector 19. The controller 30 may further be coupled to a display 31 to display notifications and/or signals detected by detector 25. The controller 30 may receive user inputs from user input device 33. The user input device 33 may include keyboard, mouse, or touchscreen. The controller may be configured to extract crystallographic information of the crystals based on the acquired datasets.

Though the TEM system is described by way of example, it should be understood that the sample image and diffraction pattern may be acquired with other charged particle microscopy systems. As another example, the charged particle microscopy system is a scanning transmission electron microscopy (STEM) system. In that case, sample images can be made in scanning STEM mode, and diffraction images can be obtained with a (quasi) parallel beam. The present discussion of the TEM system is provided merely as an example of one suitable imaging modality.

Figure 3:
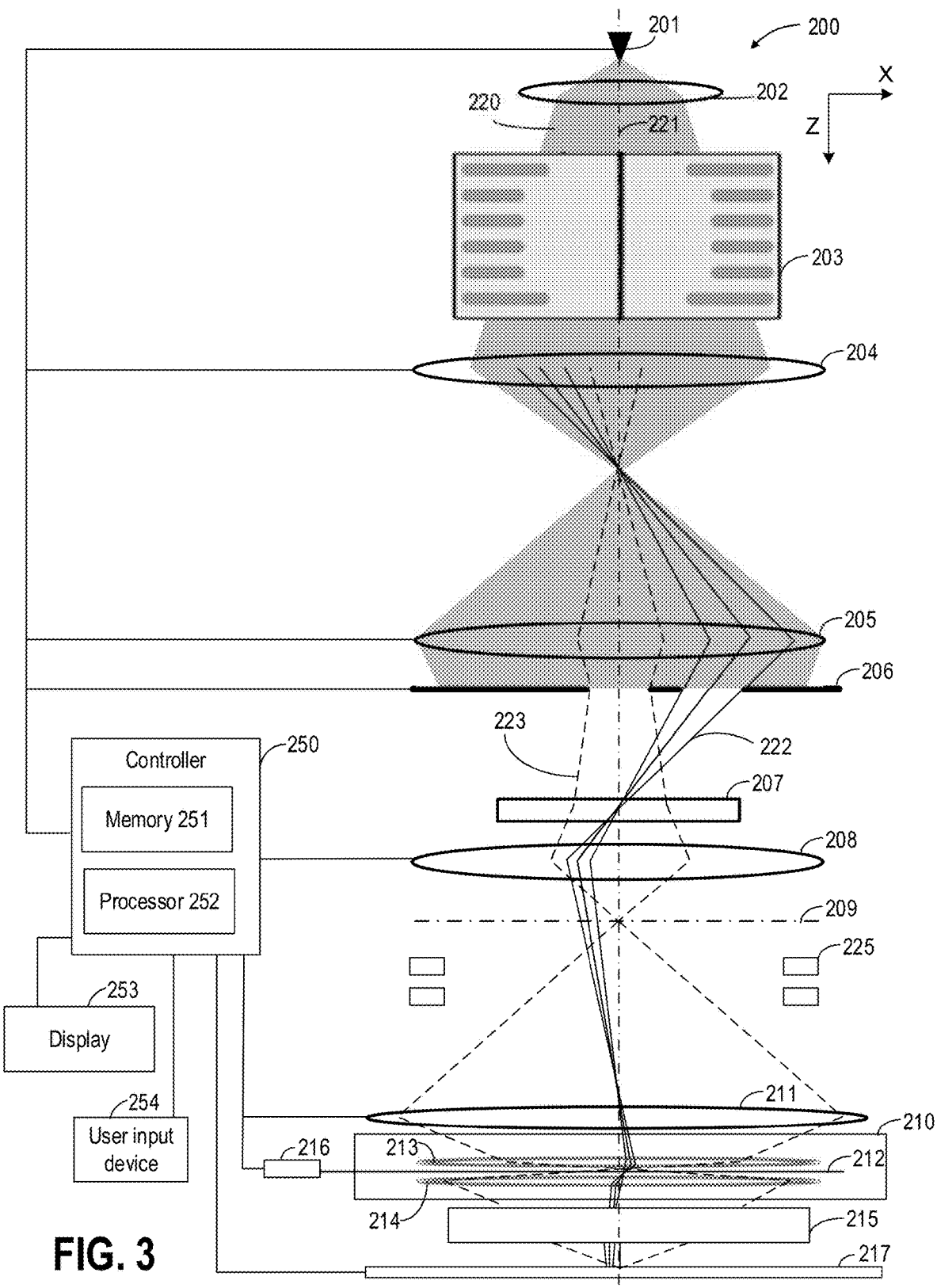
FIG. 3 illustrates an example bifocal microscopy system in the X-Z plane.
Figure 4:
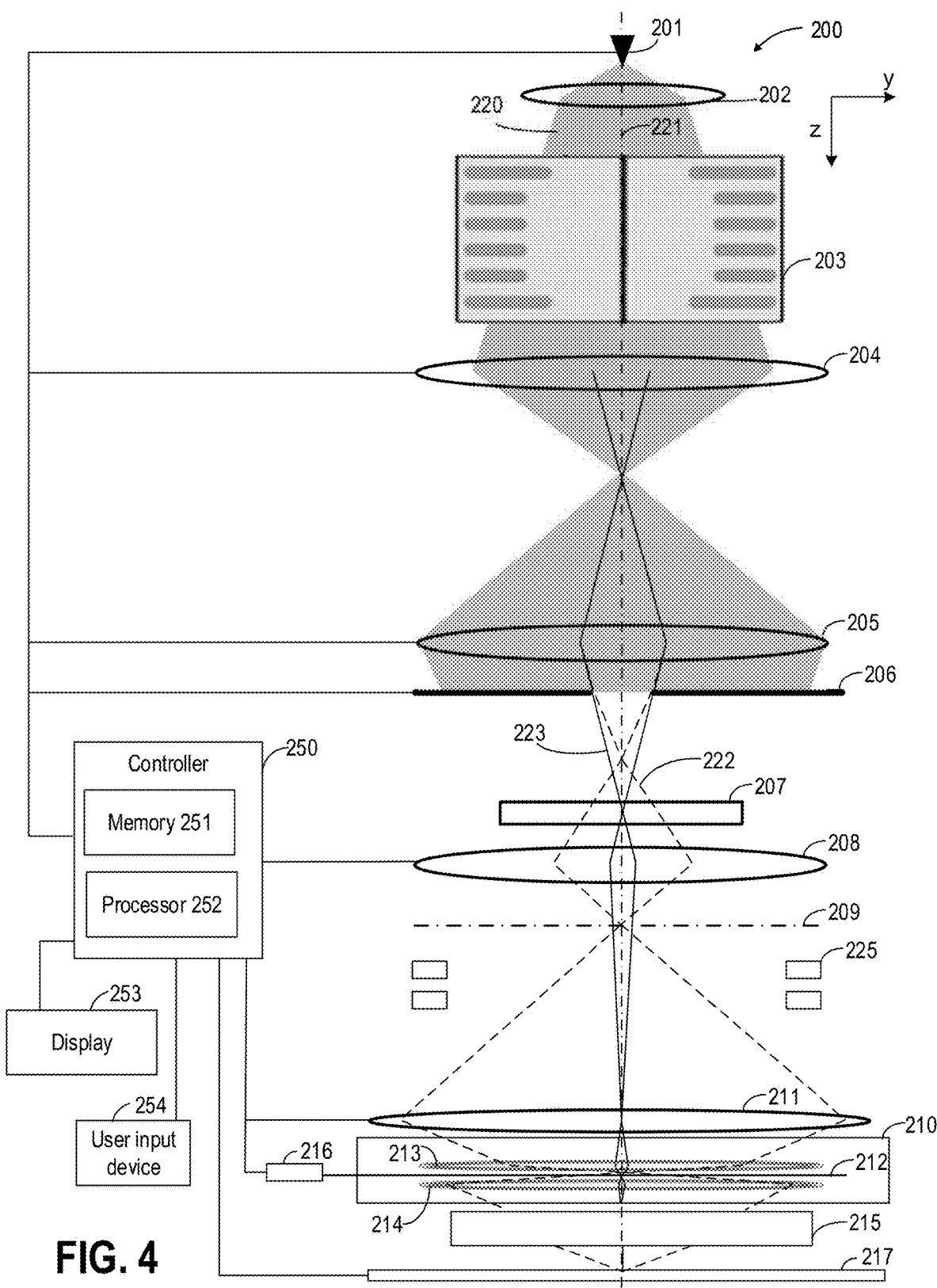
FIG. 4 illustrates the bifocal microscopy system of FIG. 3 in the Y-Z plane.
Figure 5:
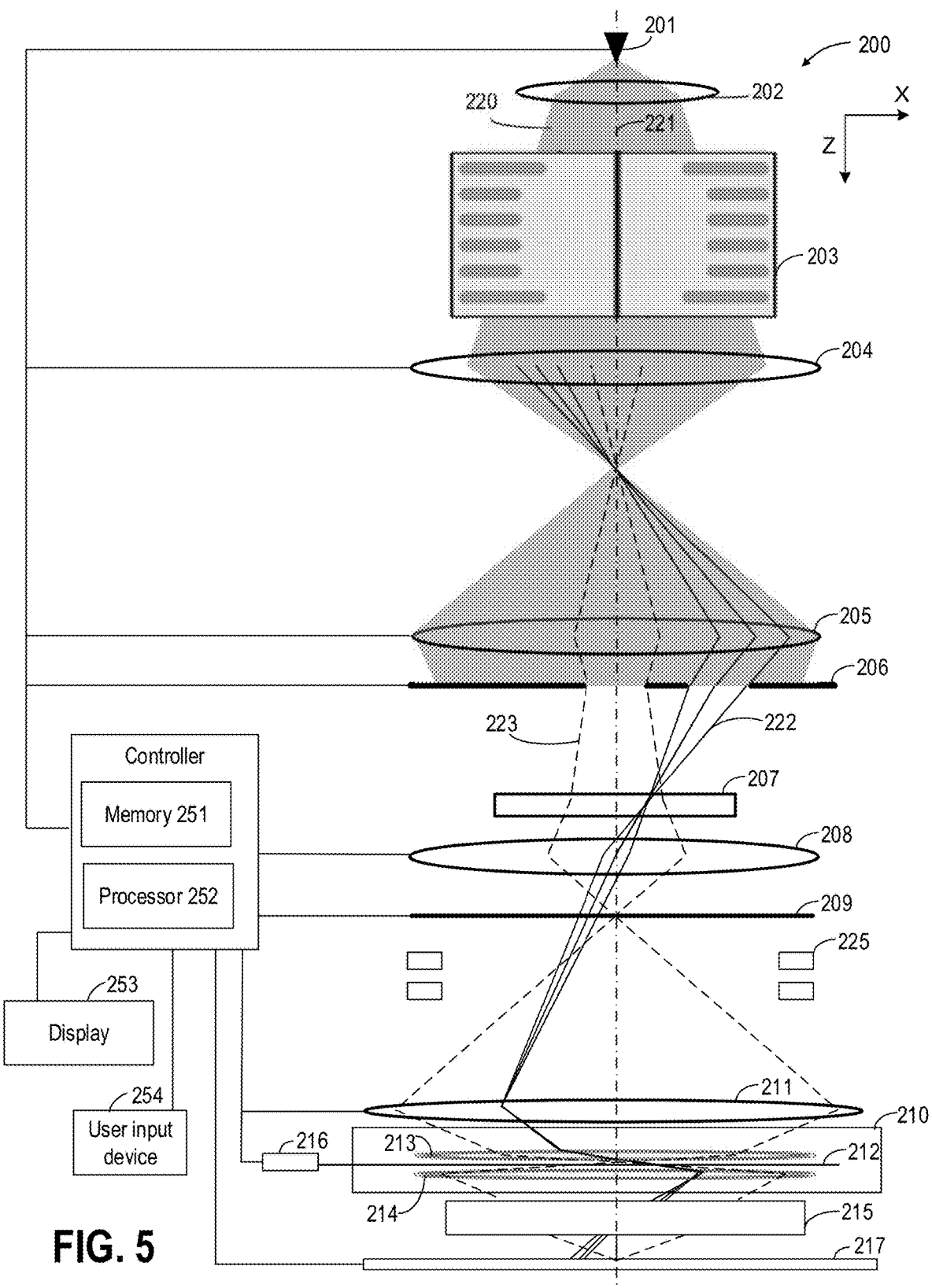
FIG. 5 illustrates tilting a diffraction beam of the bifocal microscopy system of FIG. 3 in the X-Z plane.

FIGS. 3-5 show an example embodiment of a bifocal microscopy system 200. The bifocal microscopy system 200 includes a bifocal beamformer for splitting the electron beam generated by an electron source into an imaging beam for acquiring sample image and a diffraction beam for acquiring the ED pattern. The bifocal beamformer may modify the focal properties of any one of the imaging beam and the diffraction beam. FIG. 3 shows the bifocal microscopy system 200 in the XZ plane and FIG. 4 shows the bifocal microscopy system 200 in the YZ plane. The imaging beam and the diffraction beam may irradiate the sample simultaneously so that the sample image and the ED pattern are acquired simultaneously by a detector. This can be accomplished by choosing a suitable defocus value for the projector 215, in which case diffraction information can be obtained while the projector system is in image mode. Alternatively, either the ED pattern or the sample image may be acquired individually by blocking or blanking the imaging beam or the diffraction beam. Comparing to the TEM system 100, the bifocal microscopy system 200 does not require lens adjustment between sample image and ED pattern acquisitions, therefore may avoid errors introduced by mode switching and reduce the overall 3D ED dataset acquisition time.

In the bifocal microscopy system 200, electron beam 220 generated by electron source 201 along optical axis 221 is focused by lens system 202 and enters accelerator 203. The electron beam exited from accelerator 203 sequentially passes through a first condenser 204, a second condenser 205, and enters bifocal beamformer 206 as a converging beam. The bifocal beamformer 206 splits the electron beam into an imaging beam 223 and a diffraction beam 222 travelling along different directions. Herein, a quadrupole electromagnetic field is generated by the bifocal beamformer to the imaging beam, which causes a change in the focal properties of the imaging beam. In order to change the focal properties of at least one of the charged particle beams, the bifocal beamformer may apply at least a quadrupole lensing effect to the at least one of the charged particle beams that focuses, stigmates, and/or otherwise modifies at least one of the beams such that the corresponding focal properties of the beams are made different. For example, bifocal beamformer expands the imaging beam in the XZ plane (as shown in FIG. 3) and focuses the imaging beam in the YZ plane (as shown in FIG. 4. The diffraction beam passes an aperture of the bifocal beamformer 206 without changing its focal property. The diffraction beam focuses on multipole device 207, which may be a stigmator, positioned downstream of the bifocal beamformer. The multipole device 207 corrects the quadrupole lensing effect caused by the bifocal beamformer on the imaging beam and makes the imaging beam cylindrically symmetric. In some examples, the multipole device is omitted and the imaging beam remains cylindrically asymmetric before irradiating the sample. After exiting the multipole device 207, the imaging beam is focused on a beam selection plane 209 by a third condenser 208 positioned downstream of the multipole device 207. In one example, the imaging beam or the diffraction beam may be selected by an aperture of the third focusing lens positioned at the beam selection plane 209. Alternatively, the aperture may be positioned at other locations downstream of the bifocal beamformer. Downstream of the third condenser 208, one or both of the imaging beam and the diffraction beam may be directed onto sample 212 by sequentially passing through the mini-condenser 211 and the pre-sample objective lens 213. The sample is held by sample holder 216 in the specimen plane. The scattered electrons from sample 212 are collected by detector 217 after passing through the post-sample objective lens 214 and projector 215, positioned sequentially along the optical axis 221 downstream of sample 212. The zoomed-in view of beam paths in area 210 is shown in FIG. 6A.

FIG. 5 illustrates bifocal system 200 with the diffraction beam being shifted and tilted in the XZ plane. Comparing to FIG. 3, the diffraction beam is tilted towards the X direction by the bifocal beamformer 206, and the beam path of the imaging beam remains the same. In FIG. 3, the diffraction beam 222 is focused on the optical axis 221 at the location of the multipole device 207. In FIG. 5, the focus of diffraction beam 222 at the multipole device 207 is shifted along the X axis. As a result, a different location of the sample, which is still within the FOV of the sample image, is probed for ED pattern collection. The beam paths in area 210 is shown in FIG. 6B.

Figure 6B:
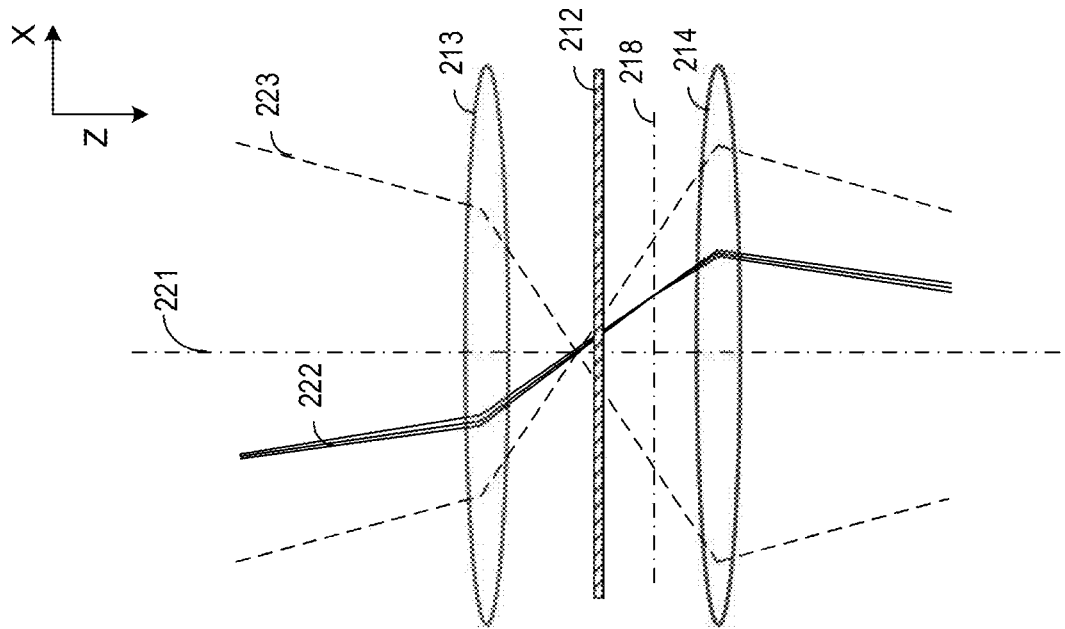
FIG. 6B is a zoomed-in view of a region in FIG. 5.
Figure 6A:
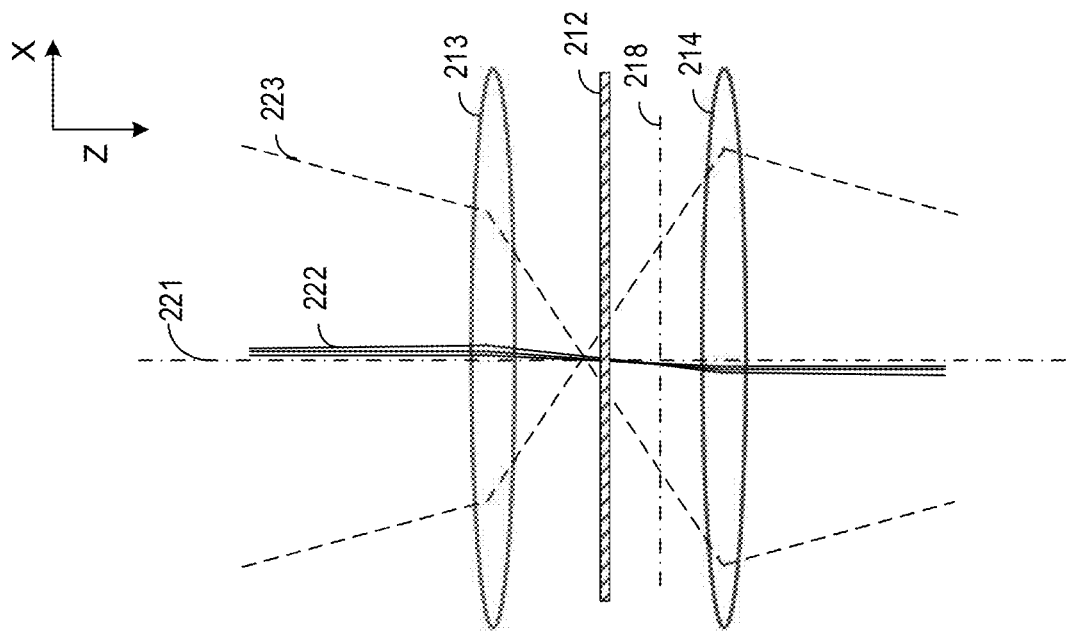
FIG. 6A is a zoomed-in view of a region in FIG. 3.

FIGS. 6A and 6B show zoomed-in view of area 210 of FIG. 3 and FIG. 5, respectively. In FIGS. 6A-6B, the beam path of imaging beam 223 is the same. The imaging beam 223 focuses on the optical axis 221, between the pre-sample objective lens 213 and sample 212. By adjusting the bifocal beamformer, the diffraction beam 222 is tilted relative to optical axis 221 in FIG. 6B comparing to FIG. 6A. In both FIG. 6A and FIG. 6B, the diffraction beam 222 is focused on the focused diffraction pattern plane 218, between sample 212 and post-sample objective lens 214. The diffraction beam is quasi-parallel at the specimen plane. The diffraction beam may have a convergence angle <5 mrad. The intersection between the diffraction beam 222 and sample 212 shifted right along the X direction from FIG. 6A to FIG. 6B. By adjusting the bifocal beamformer, different sample areas within the FOV of the sample image acquired by the imaging beam may be probed with the diffraction beam. In this way, different crystals can be selected for diffraction analysis.

In one example, a second deflector (such as image deflector 45 in FIGS. 1-2) may be positioned between the sample and the detector for shifting and tilting the electrons transmitted through the sample back to the optical axis.

In another example, a third beam deflector 225 may be positioned downstream of the third condenser 208 for shifting and tilting the diffraction beam. Instead of the bifocal beamformer, the third beam deflector can be used for selecting the crystals for diffraction probing. Note that the second beam deflector 225 also affect the imaging beam.

In yet another example, the imaging beam and the diffraction beam may be interchanged. For example, the diffraction beam may travel along the optical axis 221, and the imaging beam traveling through an aperture offset from the optical axis. In another example, the focal property of the diffraction beam is changed via the bifocal beamformer, and the focal property of the imaging beam remains the same. In yet another example, both focal properties of the diffraction beam and the imaging beam are changed by the bifocal beamformer, while the focal properties of the diffraction beam and the imaging beam are different.

The controller 250 may control the operation of the bifocal microscopy system 200, either manually in response to operator instructions or automatically in accordance with computer readable instructions stored in non-transitory memory (or computer readable medium) 251. The controller 250 may include a processor 252 and be configured to execute the computer readable instructions and control various components of system 200 in order to implement any of the methods described herein. The controller 250 may adjust the energy of the charged particle beam irradiated towards the sample by adjusting the high voltage level of the charged particle source 201. The controller 250 may adjust the sample position and/or orientation by adjusting the sample holder 216. The controller 250 receives data acquired from detector 217 and generates sample image and/or ED pattern based on the acquired data. The controller 250 may further be coupled to display 253 to display notifications and/or images of the sample. The controller 250 may receive user inputs from user input device 254. The user input device 254 may include keyboard, mouse, and/or touchscreen. The controller may be configured to extract crystallographic information of the crystals based on the acquired ED datasets.

The controller 250 may adjust the beam properties of the imaging beam and/or the diffraction beam at the specimen plane by adjusting the bifocal beamformer 206. For example, adjusting the beam tilt angle of the diffraction beam at the specimen plane may include adjusting the degree of deflection of the diffraction beam at the bifocal beamformer, wherein the degree of deflection may be adjusted by adjusting the dipole strength of the bifocal beamformer. Adjusting the optical properties of the charged particle beams at the specimen plane (such as the illuminated area, ratio of diameter of the two beams, and mutual tilt angle between the two beams) includes adjusting the excitation of one or more condenser lenses. Further, the system may include additional condenser lenses to provide the flexibility. In some embodiments, instead of positioning the bifocal beamformer downstream of the accelerator, the bifocal beamformer may be positioned upstream of the accelerator and the sample, and the multipole element positioned between the bifocal beam former and the sample.

The controller 250 may adjust the bifocal beamformer 206 and one or more lenses in the optical column for switching between the bifocal multibeam imaging mode and the normal TEM, and/or scanning transmission electron microscopy (STEM). In the normal TEM and STEM mode, only one charged particle beam is formed by the optical column.

Figure 7:
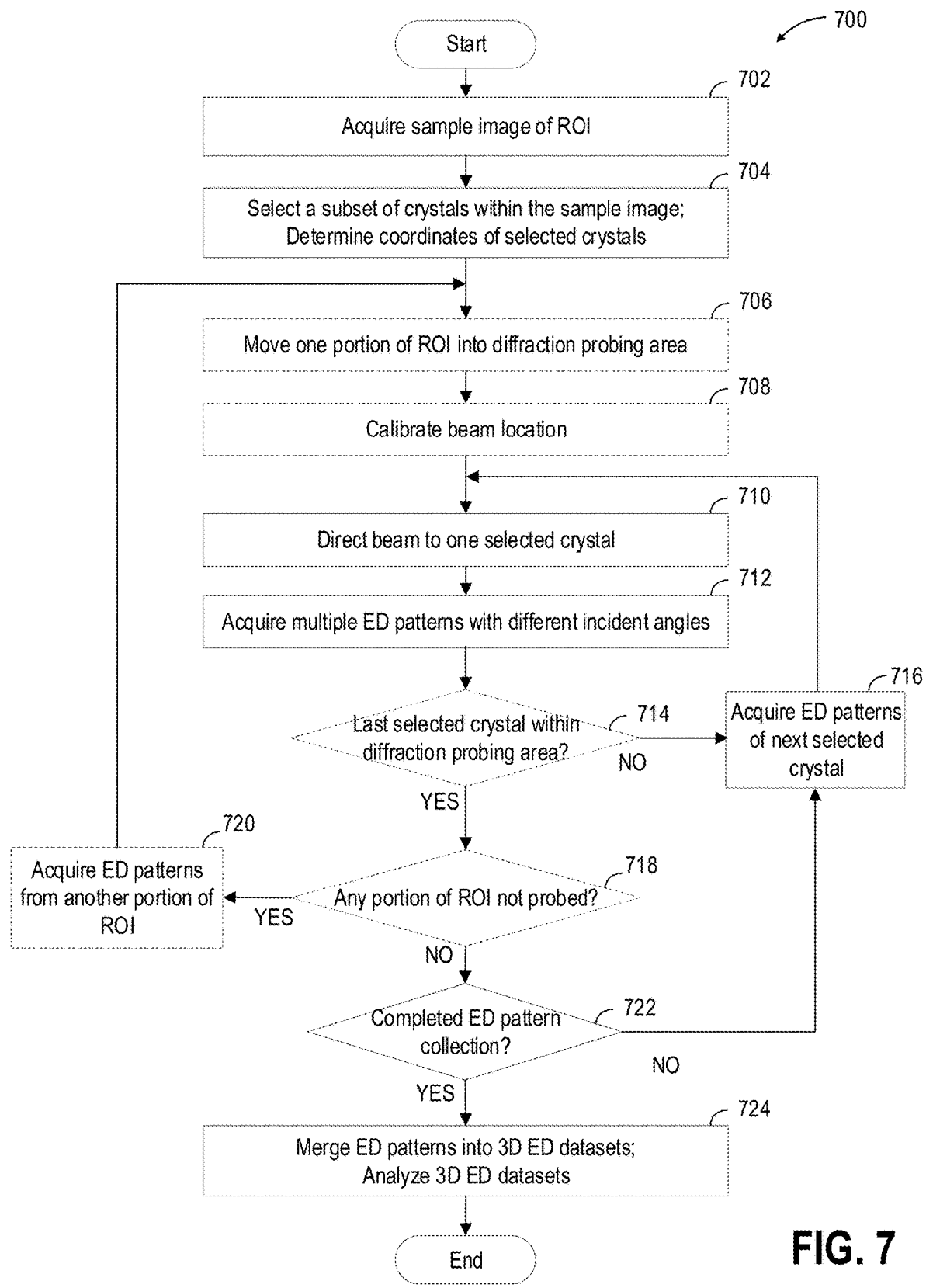
FIG. 7 shows an example method for three-dimensional diffraction data acquisition.

FIG. 7 shows method 700 of acquiring the 3D ED dataset for determining crystal structure. Multiple crystals of the sample are positioned in a specimen plane of the microscopy system, such as the microcopy systems of FIGS. 1-5. In one example, the crystals are randomly distributed on a TEM grid attached to a sample holder. The crystals in a region of interest (ROI) are selected based on a sample image for ED pattern acquisition. The selected crystals are probed by a parallel or quasi-parallel electron beam by shifting the electron beams in the specimen plane. At the location of each selected crystal, the electron beam is tilted to acquire multiple ED patterns with different incident angles. The ED patterns of the selected crystals can be merged to form a complete 3D ED dataset for solving the 3D molecular structure. More importantly, multiple 3D ED datasets of different crystals in the sample can be compared for extracting statistically relevant crystallographic information.

At 702, the sample image is acquired showing the ROI of the sample. The resolution of the sample image is sufficiently high to resolve the crystals. For example, each crystal can be represented by multiple pixels in the sample image. The sample image may be used for crystal selection. Further, locations of the crystals and the TEM grid windows can be established based on the sample image.

Figure 8A:
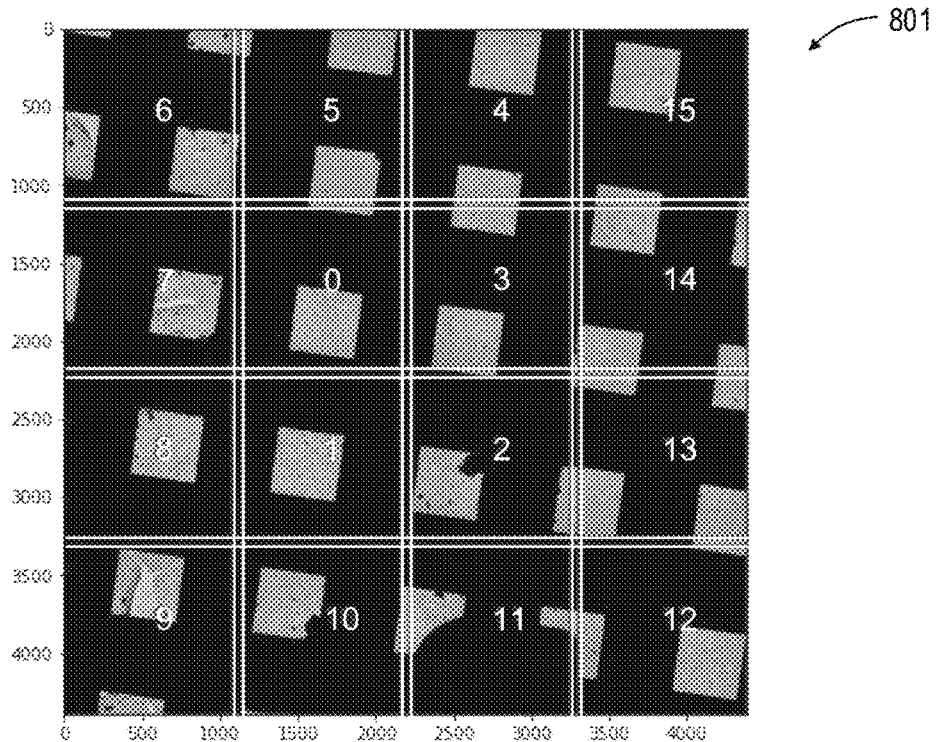
FIG. 8A shows an example overview image.

To cover a large sample area (or a large ROI), the sample image may be an overview image formed by stitching multiple sample images together. FIG. 8A shows an example overview image 801 generated from multiple sample images. Each sample image covers a tile indexed from 0 to 15. The sample images may be acquired by scanning the sample in a spiral scanning pattern by shifting the sample in the specimen plane, following the sequence of the tile index. The sample images in this example are acquired in the LM imaging mode, with 400× magnification.

Turning back to FIG. 7, at 704, a subset of crystals within the sample image are selected for 3D ED data acquisition. The crystals may be selected based on one or more of the size, the morphology, the shape, the image contrast, and the distribution of the crystal. In one example, crystals with diameters within a predetermined diameter range may be selected. The diameter range may be determined based on the estimated crystal size so that a large cluster of multiple crystals and/or debris on the TEM grid are not probed for ED pattern. In another example, crystals with a distance greater than a predetermined minimum distance from adjacent crystals are selected. The minimum distance may be determined based on the size of the diffraction beam at the specimen plane and the range of the incident angle to ensure that only one crystal is probed for ED pattern. The coordinates of the selected crystals are determined based on the sample image. Further, location of the TEM grid windows (such as coordinates of the center of each hole) may be determined based on the sample image. The coordinates may be the pixel number in the sample image. The crystals may be selected and located using computer vision and/or AI assisted imaging processing method.

In some examples, step 704 may include determining whether the particle shown in the sample image is a crystal based on whether diffraction peaks can be observed in the ED pattern when the particle is probed under diffraction mode. Any particle that cannot generate the ED pattern is excluded from the subset of crystals.

Figure 8B:
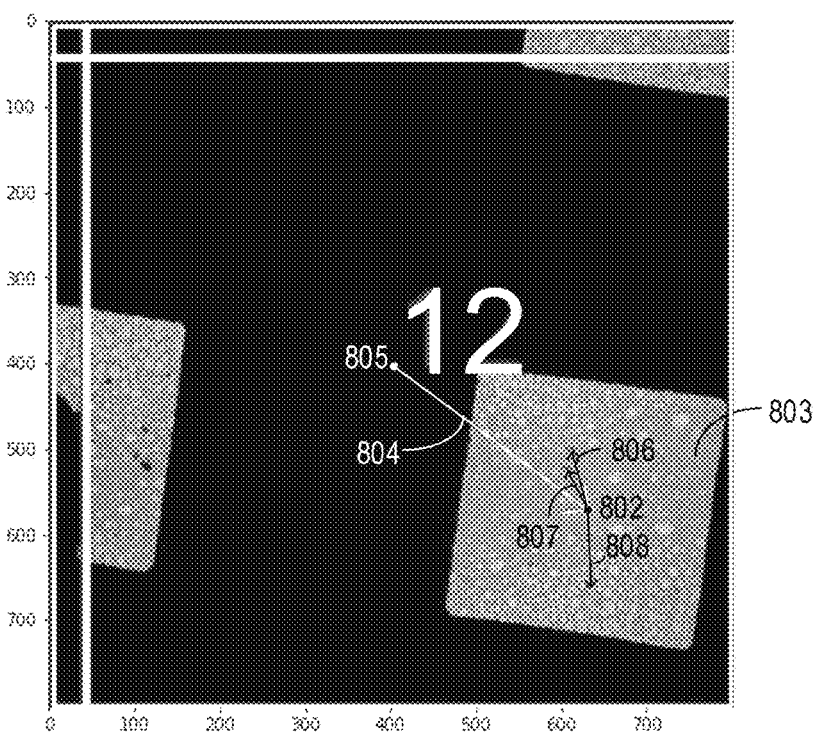
FIG. 8B shows sample image of a part of FIG. 8A.

At 706, if the area for probing the crystals for ED collection is smaller than the ROI, a portion of the ROI is optionally translated into the diffraction probing area so that multiple selected crystals within the portion may be probed without sample movement or tilt by the sample holder. The diffraction probing area may be determined based on the beam deflection range for shifting the beam in the specimen plane. For example, the sample holder may shift a TEM grid window into the diffraction probing area based on the coordinates of the grid window center. FIG. 8B shows that by shifting the TEM grid with the sample holder, the optical axis shifts from the center 805 of tile 12 to the center 802 of grid window 803, in the direction indicated by arrow 804. However, sample movement inaccuracy may cause the optical axis to misalign with the center of the grid window and electron beam location needs to be calibrated.

At 708 of FIG. 7, the electron beam location may optionally be calibrated. Through the calibration, beam location error introduced by lens adjustment (such as lens adjustment during mode switching) and/or sample movement may be corrected. For example, beam location calibration may correct beam displacement due to the mode switching from the LM imaging mode to the SA imaging mode or the SA diffraction mode at 702, and/or stage inaccuracy when moving a particular TEM grid window into the FOV at 706.

Figure 9B:
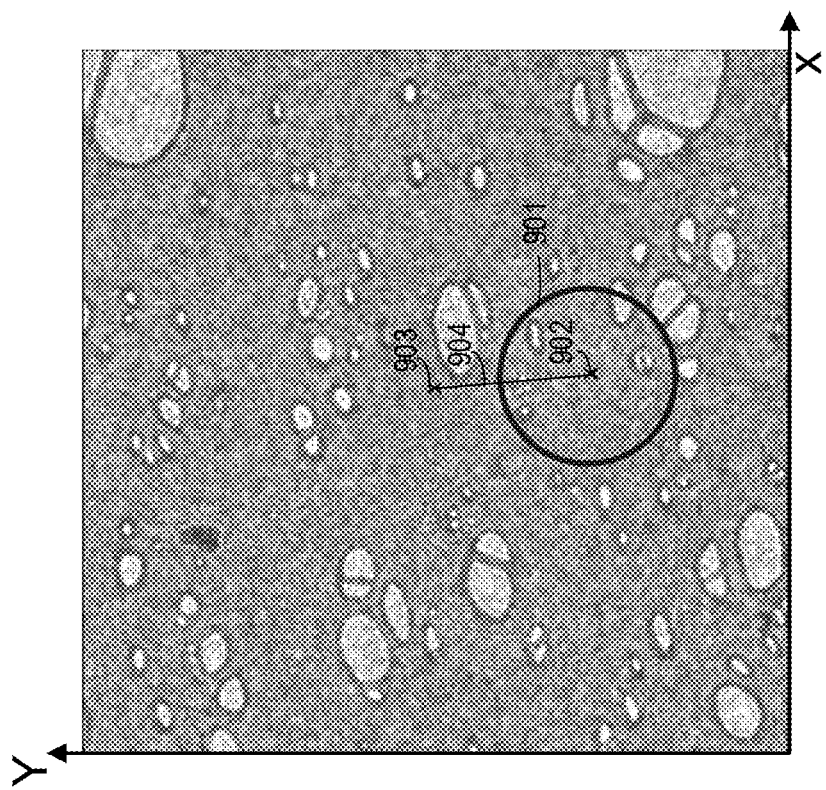
FIG. 9B is another sample image including a sample area imaged in FIG. 9A.
Figure 9A:
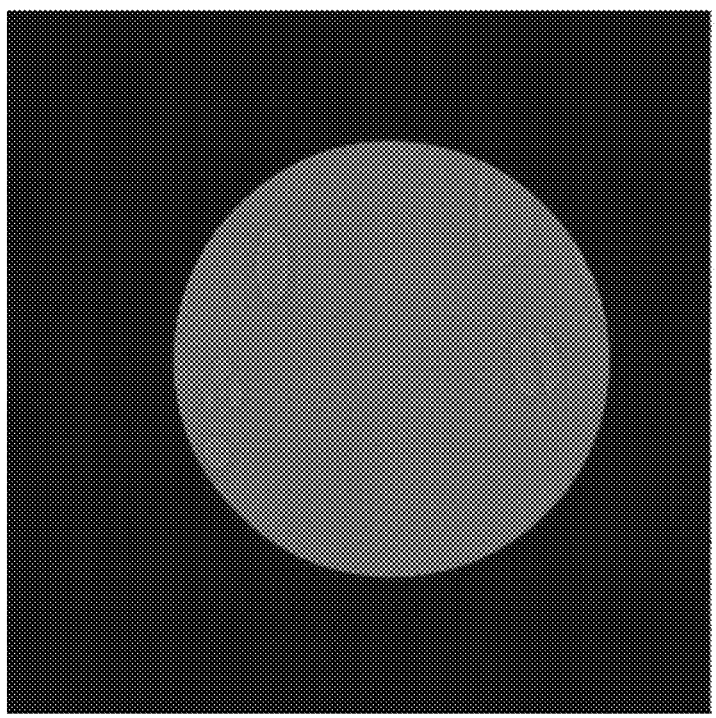
FIG. 9A is an example selected-area sample image.

Calibrating the beam location may include determining a beam displacement by comparing a second sample image acquired at the current beam location with the sample image of the ROI from 702. The second sample image may have a higher resolution and smaller FOV comparing to the sample image at 702. For example, after sample movement at 706, a SA sample image at 10K× magnification, such as SA sample image FIG. 9A, is acquired in the SA imaging mode, as shown in FIG. 2. The beam displacement is determined by registering the SA image with sample image FIG. 9B acquired at step 702. The circled area 901 in FIG. 9B is imaged in SA image FIG. 9A. The center 902 of the circled area 901 displaced from the center 903 of sample image FIG. 9B, indicating that there is beam displacement 904 from the beam location at step 702 to the current beam. In one example, the electron beam may be shifted back to the its expected location, such as center 903 of grid hole. In another example, coordinates of the selected crystals may be updated based on the beam displacement.

The beam displacement along the X and Y axes of the sample image may be expressed as [Δx, Δy], wherein Δx, Δy are projections of beam displacement 904 on the X and Y axes, respectively. The beam shift for correcting the beam displacement may be calculated as:

$$\begin{pmatrix} BS\_x \\ BS\_y \end{pmatrix} = \begin{pmatrix} a & -b \\ b & a \end{pmatrix} \begin{pmatrix} \Delta x \\ \Delta y \end{pmatrix}, \quad \text{(Equation 1)}$$

wherein BS_x and BS_y are beam shift to correct the beam displacement; a and b are known parameters representing the relationship, such as rotation and scaling, between the beam displacement and the beam shift. The beam shift BS_x and BS_y may be current settings of the deflector coils. The beam shift BS_x and BS_y may be applied to the deflector when shifting the beam to each of the selected crystal at 710.

At 710, the electron beam is directed to one of the selected crystals in the diffraction probing area for ED pattern collection by shifting the electron beam in the specimen plane. The location of the selected crystal may be the coordinates determined from 704, or the updated coordinates from 708.

At 712, multiple ED patterns of the crystal are acquired by tilting the electron beam, so that each ED pattern is acquired at a different incident angle. The incident angles are different when the values of the incident angles are different or the planes of incident angles (or the planes of incidence) are different. In one example, the electron beam is tilted in one or more planes orthogonal to the specimen plane. In another example, the electron beam is tilted spirally relative to an axis, such as the optical axis. In another examples, the beam is tilted in precession at a fixed tilt angle, or a combination of precession and tilt angle variation (e.g. spiral scan). The electron beam may be tilted relative to a beam pivot point. The beam pivot point may locate between the pre-sample objective lens and the post-sample objective lens. In one example, the beam pivot point is between the specimen plane and the post-sample objective lens. In another example, the beam pivot point in on the specimen plane. The beam pivot point may be on the optical axis for a TEM or STEM system. The electron beam is tilted within a beam tilt range so that the beam shift caused by pre-specimen lens aberrations on the specimen plane is small compared to the beam size. In other words, the same selected crystal is irradiated by the electron beam despite the beam shift induced by the beam tilt. The range of the incident angle may be less than 20 degrees. In one example, the incident angle is from −10 to 10 degrees. In another example, the incident angle is −5 to 5 degrees. In some examples, the beam tilt schemes may incorporate corrections for optical aberrations, to minimize beam displacement at the sample and to correct for small deviations from the desired tilt increment.

In one example, the ED patterns may be collected at discrete incident angles. That is, one ED pattern is acquired after tilting the beam for a step size angle. In another example, the ED patterns may be collected while the beam is continuously tilted. As such, each ED pattern covers a range of incident angles, wherein the range depends on the beam tilt speed and the data acquisition speed for each ED pattern.

In another example, step 714 may check the quality of the acquired diffraction patterns and determine whether to include them in the 3D ED datasets. If the acquired ED pattern is not a typical ED pattern of a crystal, method 700 may stop collecting the ED patterns at the current location and move to 714.

At 714, method 700 optionally checks whether ED patterns of all selected crystals in the diffraction probing area have been collected. If the answer is NO, method 700 proceeds to 716 to acquire the ED patterns of the next selected crystal. If ED patterns of all selected crystals in the current diffraction probing area have been collected, method 700 proceeds to 718 to check whether any portion of the ROI has not been probed. If there is any portion of the ROI left to be probed for ED pattern, method 700 moves to 720 to acquire ED patterns from another portion of the ROI. For example, if there any TEM grid window left, the next TEM grid window is moved into the diffraction probing area for ED pattern acquisition. If all of the ROI has been probed, method 700 proceeds to 722. In some examples, if the diffraction probing area is not smaller than the ROI, method 700 may skip steps 714 and 718, and proceeds to 722 directly from 712.

At 722, method 700 checks whether the ED pattern collection is complete. If the ED pattern collection is complete, method 700 proceeds to 724. If the answer is NO, ED patterns of the next crystal are acquired. In one example, the sample may optionally be rotated about a sample rotation axis in the specimen plane with the sample holder, and ED patterns of the selected crystals on the rotated sample are acquired with beam tilt. The sample rotation angle may be greater than the maximum beam tilt angle. For example, the sample rotation angle may be 30-60 degrees. When probing selected crystals (such as selected crystals in a TEM grid window) away from the sample holder rotation axis, the sample holder may also be adjusted in the z-direction, along the optical axis, to bring the crystals towards the specimen plane.

At 724, the ED patterns from all of the selected crystals are sorted, indexed, and classified based on various parameters (phase, crystal symmetry, SNR of pattern, etc). ED patterns of the same class are merged into a 3D ED dataset, and molecule 3D structure may be determined using conventional electron crystallography software packages. More importantly, statistical information of the sample can be extracted from multiple 3D ED datasets. The statistical information may include sample purity, mixture ratios of the sample, polymorphs of a certain crystal, phase distribution, and chirality of the sample. In some embodiments, step 724 includes centering and distortion correction of the ED patterns due to, for example, beam tilt, before merging the ED patterns.

In this way, ED patterns of a larger number of crystals can be efficiently and quickly acquired. Multiple 3D ED datasets may be obtained for extracting statistically relevant crystallographic information. Comparing to tilting the crystal with the sample holder, method 700 does not require setting the crystal at eucentric height or complicated sample tracking. Comparing to acquiring one ED pattern for each crystal, by tilting the electron beam, precise and finely angular sampled ED patterns can be acquired, probing a 3D section of reciprocal space, which eliminates the requirement of prior information on lattice parameters for determining the crystal structure.

In another embodiment, method 700 may be executed using the bifocal microscopy system shown in FIGS. 3-5. The sample image of the ROI may be acquired using the imaging beam and ED patterns of each selected crystal may be acquired using the diffraction beam. Because switching between sample imaging and ED pattern acquisition does not require adjusting any lens in the optical column, the frequency of beam location calibration may be reduced.

Figure 10:
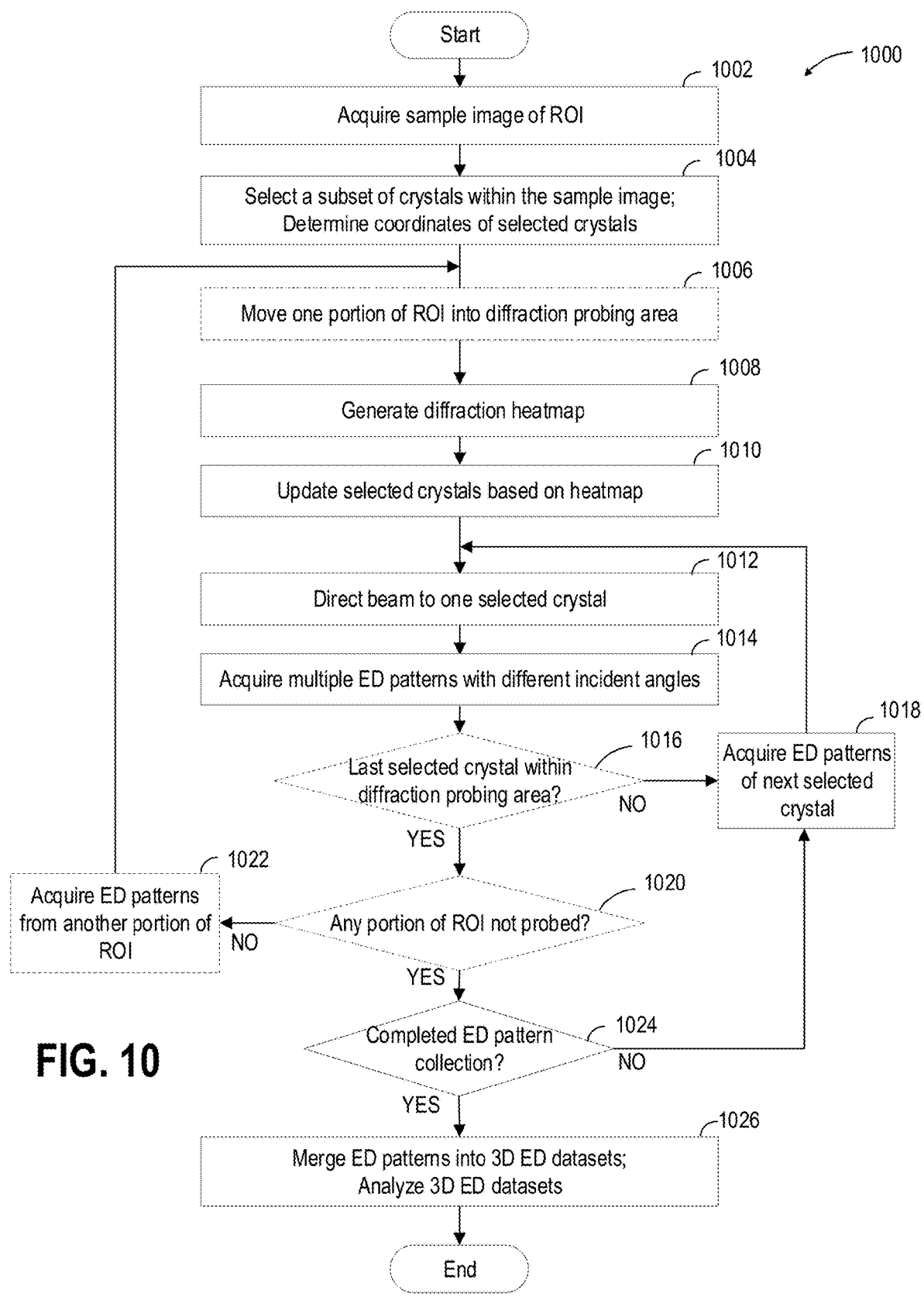
FIG. 10 shows another example method for three-dimensional diffraction data acquisition.

FIG. 10 shows another example method 1000 of acquiring the 3D ED dataset for determining structure of a crystalline sample. Different from method 700 shown in FIG. 7, in method 1000, after selecting the crystals based on the sample image, a diffraction heatmap is generated by scanning the sample and acquiring an ED pattern at each scanning location. In one example, the sample is scanned with the electron beam using the TEM system in the diffraction mode (such as the SA diffraction mode shown in FIG. 2). In another example, the sample is scanned with the diffraction beam of the bifocal microscopy system. At each scanning location, a diffraction score representing the quality of the ED pattern is generated. A diffraction heatmap is generated with the diffraction scores. The crystals may be re-selected based on the diffraction heatmap. Further, coordinates of the selected crystals may be updated based on the diffraction heatmap.

At 1002 and 1004, similar to steps 702 and 704 of FIG. 7, the sample image include a ROI of the sample is acquired by setting the microscope in the imaging mode. The sample image may be stitched together from multiple images acquired by translating the sample stage.

At 1006, if the diffraction probing area of the microscope is smaller than the area of the ROI, a portion of the ROI is optionally moved into the diffraction probing area. In some examples, after sample movement at 1006, the beam location may be calibrated as shown in step 708 of FIG. 7.

Figure 11:
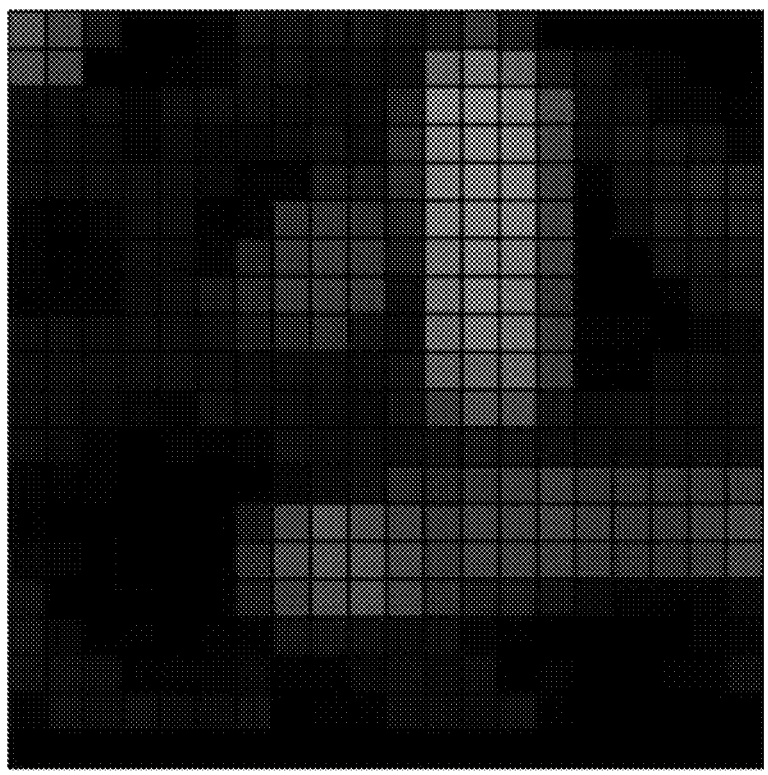
FIG. 11 is an example diffraction heatmap.

At 1008, a diffraction heatmap is generated. The diffraction heatmap may be generated by scanning the diffraction probing area with the electron beam (or the diffraction beam of the bifocal microscope) and/or moving the sample position in the specimen plane with the sample holder. The step size of the scan may be determined by the beam size at the specimen plane. For example, the step size may increase with the increased beam size. The step size may be further determined based on the range of the incident angle. At each scanning location, an ED pattern is acquired and scored. The diffraction score representing the quality of the ED pattern. For example, the diffraction score increases with increased intensity of the ED pattern. The pixel values of the diffraction heatmap corresponds to the diffraction score of the ED pattern at the corresponding scanning location. FIG. 11 shows an example diffraction heatmap. Pixels with higher intensity (brighter) correspond to higher diffraction score.

At 1010, the crystals selected at 1004 is updated based on the heatmap. For example, crystals corresponding to pixels with diffraction scores lower than a threshold diffraction score are removed from the subset of selected crystals. Further, beam location may be corrected based on the heatmap. For example, beam location may be corrected by comparing the coordinates of selected crystals determined at 1004 with the heatmap, as location of high diffraction score in the heatmap correlates to crystal location. Further, the diffraction heatmap may optimize the diffraction probing. For example, for a large crystal, sub-regions within the crystal which have high diffraction scores may be selected, and multiple ED patterns may be acquired at each sub-region of the crystal.

At 1012, the electron beam is directed to one of the selected crystals by beam shift, and multiple ED patterns of the crystal are acquired at 1014 by beam tilt. In one example, the coordinates of the selected crystals are the coordinates determined at 1004. In another example, the coordinates of the selected crystals are the updated coordinates determined at 1010. In yet another example, the coordinates of the selected crystals are determined based on the diffraction heatmap. The coordinates of the selected crystals may be locations in the diffraction heatmap with high diffraction score and separated from other high diffraction scores with a distance greater than a threshold distance.

If the diffraction probing area is smaller than the area of the ROI, at 1016, method 1000 checks whether all crystals in the diffraction probing area have been probed. If the answer is NO, ED patterns of the next selected crystal are acquired at 1018. Otherwise, method 1000 moves to 1020 to check whether any portion of the ROI has not been probed for ED pattern acquisition. If all of the ROI have been probed, method 1000 proceeds to 1024. If there is any portion of the ROI left to be probed, method 1000 proceeds to 1022 to acquire ED patterns from another portion of the ROI.

At 1024, method 2000 checks whether the ED pattern collection is complete. If the answer is NO, ED patterns of the next selected crystal are acquired at 1018. If the answer is YES, at 1024, the ED patterns from all selected crystals are merged to form a complete 3D ED dataset, and crystal structure is determined based on the complete 3D ED dataset.

In another example, a diffraction heatmap may be generated for the entire ROI after or before acquiring the sample image, and the crystals are further selected based on the diffraction heatmap at 1004. Further, crystal locations may be determined based also on the diffraction heatmap. In one example, the diffraction heatmap may be acquired by operating the microscope in the diffraction mode, such as the SA diffraction mode shown in FIG. 2.

In one embodiment, method 1000 may be executed using the bifocal microscopy system shown in FIGS. 3-5. The sample image of the ROI may be acquired using the imaging beam. The diffraction heatmap and ED patterns of each selected crystals may be acquired using the diffraction beam.

The technical effect of acquiring a sample image is to select crystals for ED pattern acquisition and determining the location or coordinates of the selected crystals. The technical effect of directing the electron beam to each of the selected crystals for ED pattern acquisition via beam shift is that beam shift is faster and introduces less error comparing to sample movement. The technical effect of tilting the electron beam at each selected crystal location to acquire multiple ED patterns is increased data acquisition speed, which allows for collecting diffraction tilt series of many (100's to 1000's) crystals. Therefore, statistically relevant crystallographic information of the many crystals can be obtained by analyzing the diffraction tilt series.

What is claimed is:

1. A method, comprising:
    acquiring a sample image of a sample;
    selecting multiple crystals in the sample image;
    determining coordinates of the multiple selected crystals;
    directing an electron beam towards each of the multiple selected crystals and acquiring multiple diffraction patterns from the multiple selected crystals without rotating or moving the sample, wherein at a location of each of the multiple selected crystals, adjusting the electron beam to acquire multiple diffraction patterns of the selected crystal at different incident angles; and extracting crystallographic information from the multiple diffraction patterns.

2. The method of claim 1, wherein acquiring multiple diffraction patterns of the selected crystal at different incident angles by tilting the electron beam includes acquiring the multiple diffraction patterns while continuously tilting the electron beam.

3. The method of claim 1, wherein acquiring multiple diffraction patterns of the selected crystal at different incident angles includes acquiring multiple diffraction patterns of the selected crystal with the incident angles from −10 to 10 degrees relative to an optical axis.

4. The method of claim 1, wherein acquiring multiple diffraction patterns of the selected crystal at different incident angles includes acquiring multiple diffraction patterns of the selected crystal with the incident angles in a range of less than 20 degrees.

5. The method of claim 1, wherein selecting the multiple crystals in the sample image includes selecting the multiple crystals based on one or more of a size, a morphology, a distribution and a contrast of the crystals in the sample image.

6. The method of claim 1, further comprising calibrating beam location relative to the sample before directing the electron beam towards one of the selected crystals.

7. The method of claim 6, wherein calibrating beam location includes acquiring a second sample image with a field of view smaller than the sample image, determining a beam displacement by comparing the second sample image with the sample image, and calibrating the beam location based on the beam displacement.

8. The method of claim 1, further comprising:
acquiring multiple diffraction patterns at multiple scanning locations within a field of view of the sample image;
generating a diffraction score for each of the multiple diffraction patterns;
generating a diffraction heatmap based on the diffraction scores; and
determining coordinates of the multiple selected crystals based further on the diffraction heatmap.

9. The method of claim 8, wherein determining coordinates of the multiple selected crystals based further on the diffraction heatmap includes determining coordinates of one or more sub-regions of at least one of the multiple selected crystals based on the diffraction heatmap.

10. The method of claim 1, wherein acquiring multiple diffraction patterns of the selected crystal at different incident angles by tilting the electron beam includes acquiring the multiple diffractions patterns of the selected crystal by tilting the electron beam in at least a plane orthogonal to a specimen plane.

11. The method of claim 1, further comprising:
after acquiring the sample image, adjusting a sample position by translating a sample holder; and
calibrating a beam location relative to the sample after adjusting the sample position, and wherein directing the electron beam towards each selected crystal includes directing the electron beam based on the coordinates of the selected crystals and the calibrated beam location.

12. A system, comprising:
an electron source for generating an electron beam along an optical axis;
a sample holder for holding a sample and adjusting a sample position;
a deflector for shifting the electron beam to irradiate different locations of the sample and tilting the electron beam to adjust an incident angle;
a detector for detecting electrons transmitted through the sample; and
a controller including a non-transitory memory for storing computer readable instructions, wherein by executing the computer readable instructions, the controller is configured to:
acquire a sample image of the sample;
select multiple crystals in the sample image;
determine coordinates of the multiple selected crystals;
direct the electron beam towards each of the multiple selected crystals by shifting the electron beam and acquire multiple diffraction patterns from the multiple selected crystals without moving or rotator the sample via the sample holder, wherein at a location of each selected crystal, tilt the electron beam to acquire multiple diffraction patterns of the selected crystal at different incident angles;
merge multiple diffraction patterns of the selected crystals into a diffraction dataset; and
extract crystallographic information from the diffraction dataset.

13. The system of claim 12, further comprising a second deflector positioned between the sample and the detector for shifting and tilting the electrons transmitted through the sample back to the optical axis with the second deflector.

14. The system of claim 12, wherein the sample is positioned on a transmission electron microscopy (TEM) grid, and the sample holder holds the sample by attaching to the TEM grid.

15. The system of claim 12, further comprising a condenser positioned between the sample and the detector, and wherein the controller is further configured to:
adjust the condenser after acquiring the sample image;
acquire a second sample image with the adjusted condenser; and
calibrate beam location by comparing the second sample image with the sample image, and wherein direct the electron beam towards one of the selected crystals includes direct the electron beam towards one of the selected crystals based on the calibrated beam location.

16. The system of claim 12, wherein the deflector is a bifocal beamformer, the bifocal beamformer splits the electron beam into a diffraction beam for acquiring the multiple diffraction patterns and an imaging beam for acquiring the sample image, wherein the imaging beam and the diffraction beam have different focal properties.

17. The system of claim 16, wherein the bifocal beamformer shifts the diffraction beam at a specimen plane and tilts the diffraction beam to adjust the incident angle, and wherein direct the electron beam towards one of the selected crystals and acquire multiple diffraction patterns of the selected crystal at different incident angles includes, direct the diffraction beam towards one of the selected crystal within a field of view of the sample image by shifting the diffraction beam and acquire the multiple diffraction patterns of the selected crystal by tilting the diffraction beam.

18. The system of claim 16, further comprising a third deflector positioned downstream of the bifocal beamformer, and wherein acquire multiple diffraction patterns of the selected crystal at different incident angles includes, acquire the multiple diffraction patterns by tilting the diffraction beam with the third deflector.

19. The system of claim 16, further comprising an accelerator positioned upstream of the bifocal beamformer, and a multipole element positioned between the bifocal beamformer and the sample.

20. The system of claim 16, further comprising an accelerator positioned between the bifocal beamformer and the sample, and a multipole element positioned between the bifocal beamformer and the sample.

21. The system of claim 16, further comprising an aperture for selectively blocking or blanking the diffraction beam or the imaging beam.

* * * * *